United States Patent
Bollinger et al.

(10) Patent No.: US 6,379,490 B1
(45) Date of Patent: *Apr. 30, 2002

(54) SYSTEM FOR IMPROVING THE TOTAL THICKNESS VARIATION OF A WAFER

(75) Inventors: L. David Bollinger; James F. Nester, both of Ridgefield, CT (US); Charles B. Zarowin, Studio City, CA (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/596,980

(22) Filed: Feb. 5, 1996

Related U.S. Application Data

(63) Continuation of application No. 08/198,931, filed on Feb. 18, 1994, now abandoned.

(51) Int. Cl.$^7$ ............................................. H01L 21/00
(52) U.S. Cl. ............................ 156/345; 438/5; 438/14; 438/710

(58) Field of Search ................... 156/345; 219/121.41, 219/121.43; 438/14, 9, 5, 710

(56) References Cited

U.S. PATENT DOCUMENTS

| | | | | |
|---|---|---|---|---|
| 5,221,427 A | * | 6/1993 | Koinuma et al. | 156/643 |
| 5,223,080 A | * | 6/1993 | Ohta et al. | 156/643 |
| 5,254,830 A | * | 10/1993 | Zarowin et al. | 156/345 |
| 5,282,921 A | * | 2/1994 | Poultney | 156/626 |
| 5,302,237 A | * | 4/1994 | Larson et al. | 156/643 |
| 5,308,447 A | * | 5/1994 | Lewis et al. | 156/626 |
| 5,346,552 A | * | 9/1994 | Yachi | 156/643 X |

* cited by examiner

*Primary Examiner*—Thi Dang
(74) *Attorney, Agent, or Firm*—Snell & Wilmer L.L.P.

(57) ABSTRACT

A system for improving the total thickness variation across a surface of a bulk semiconductor wafer includes an initial total thickness variation measuring instrument. The initial total thickness variation profile is then converted to a dwell time versus position map. A confined plasma is then used to selectively locally remove material from the surface so that the final surface of the bulk semiconductor has an improved final total thickness variation.

17 Claims, 2 Drawing Sheets

SYSTEM FOR IMPROVING THE TOTAL THICKNESS VARIATION OF A WAFER

This application is a continuation of application Ser. No. 08/198,931, filed Feb. 18, 1994 now abandoned.

BACKGROUND OF THE INVENTION

The present invention generally relates to a system for improving the total thickness variation across a surface of a bulk semiconductor wafer and, in particular, relates to one such system having means for measuring the initial total thickness variation of the surface of the bulk semiconductor wafer.

As the size of semiconductor devices decreases and the requirements for more devices to be formed on a given wafer increases, the density requirements of the semiconductor device manufacturers increases. As a result, what used to be acceptable thickness variations across tie surface of a semiconductor wafer is rapidly becoming unacceptable since, as the individual devices become smaller, the impact on each surface variation becomes more significant, i.e., each variation in the surface of a semiconductor may now catastrophically affect a plurality of devices and thus reduce the yield from the wafer more significantly. Hence, one of the factors limiting the chip or circuit density available to the semiconductor industry is the total thickness variation across the surface of the semiconductor wafer.

Currently, a bulk semiconductor wafer is cut, typically be use of a diamond saw blade device, from a semiconductor boule that is grown with a predetermined crystalline orientation. Once sawed, the bulk semiconductor wafer is subjected to numerous grinding and polishing processes with a combination of coarse and fine abrasives to remove damage induce by the sawing device. The wafer surface is subsequently treated with a combination of very fine abrasives and reactive liquids to remove the damage induced by the coarse grinding and polishing processing. The grinding and polishing operations are intended to uniformly remove material from every location on the wafer surface simultaneously. Further, to achieve economical advantages in the production processing of bulk semiconductor wafers, such operations are typically conducted on several wafers at a time, generally referred to as batch operation.

The general result of such batch processing is that individual bulk semiconductor wafers produced by this method may have surfaces that deviate from planarity by about 5 micrometers. Such deviation may be increased when the wafer is constrained, or mounted, for subsequent processing, by a planar vacuum mounting device, such as a vacuum chuck. This non-planarity creates significant problems in advanced device fabrication processes employing microlithographic exposure tools which typically have a limited depth of focus. Further, the finished surfaces of such wafers may conceal small, but significant amounts of subsurface crystalline damage resulting from the grinding and polishing operations.

Typically, with current minimum circuit pattern sizes between 0.5 micrometers and 1 micrometer, lithographic systems have a depth of field of about 0.5 micrometers. It is anticipated that next generation devices will have pattern sizes less than 0.5 micrometers and the depth of field of optical lithographic systems will be about 0.1 micrometers. Hence, the variation in the surface thickness should be such that features of this size can be formed without encountering a thickness variation that disturbs or prevents such a feature from being fabricated. However, it is quite clear that in order to ensure that any area on the wafer selected for an exposure field is flat, the entire surface of the wafer must be worked to that flatness.

Consequently, a system for improving the total thickness variation of a surface of a bulk semiconductor wafer is greatly needed and desired in the semiconductor industry.

SUMMARY OF THE INVENTION

Accordingly, it is one object of the present invention to provide a system for improving the total thickness variation of the surface of a bulk semiconductor wafer that substantially overcomes the above-recited drawbacks of conventional systems.

This object is accomplished, at least in part, by a system for improving the total thickness variation of a surface of a bulk semiconductor wafer that includes means for measuring the initial total thickness variation of a surface to be treated and means for selectively removing material from the surface of the wafer in accordance with the measured initial total thickness variation such that the final total thickness variation is minimized.

Other objects and advantages will become apparent to those skilled in the art from the following detailed description read in conjunction with the appended claims and the drawings attached hereto.

DESCRIPTION OF THE DRAWINGS

The drawings, not drawn to scale, include.

DETAILED DESCRIPTION OF THE INVENTION

Figure 1:
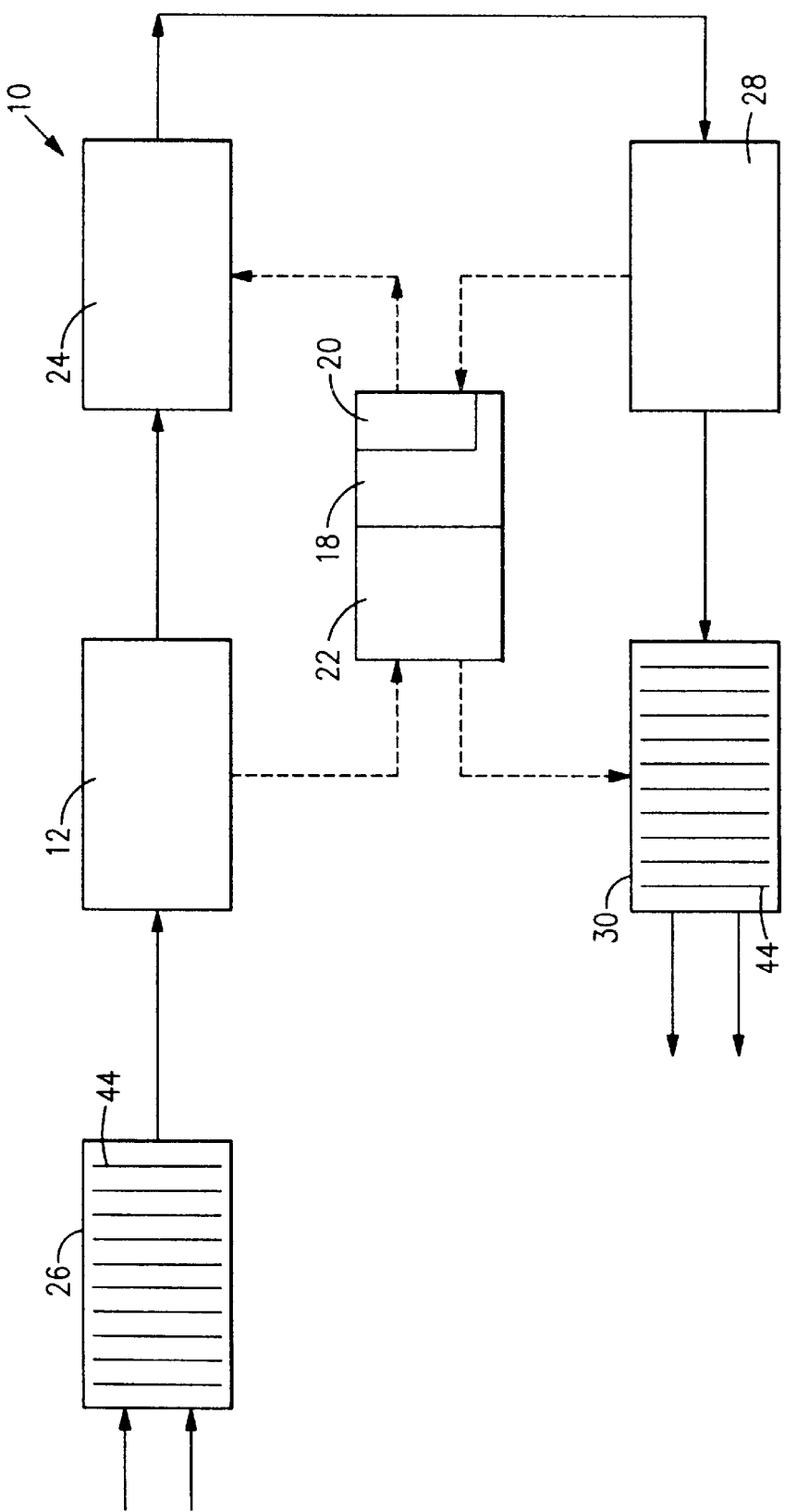
FIG. 1 which is a block diagram of a system for improving the total thickness variation of a bulk semiconductor wafer embodying the principles of the present invention.

A system for improving the total thickness variation of a surface of a bulk semiconductor wafer, generally indicated at 10 in FIG. 1 and embodying the principles of the present invention, includes means 12 for determining an initial total thickness variation profile for a surface 14 of a bulk semiconductor wafer 16, means 18 for converting the initial total thickness variation profile to a dwell time versus position map 20 stored in a system controller 22 and means 24 for selectively locally removing material from the surface 14 in accordance with the dwell time versus position map 20 such that the semiconductor wafer 16 has a final total thickness variation profile that is minimized.

In one particular embodiment, the system 10 can also include means 26 for delivering one or more bulk semiconductor wafers 16 to the initial total thickness variation profile determining means 12, means 28 for determining the final total thickness variation profile of surface 14 of the wafer 16 subsequent to removing material therefrom, and means 30 for transporting one or more bulk semiconductor wafers 16 from the means 24 for selectively locally removing material from the surface 14.

Figure 2:
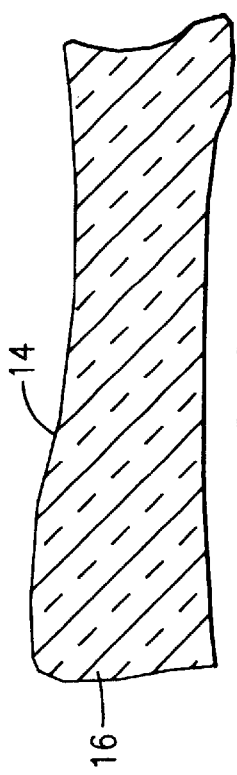
FIG. 2 which is a cross-sectional view of a section of a bulk semiconductor wafer prior to being processed by the system for improving the total thickness variation of a wafer shown in FIG. 1.

As shown in FIG. 2 a typical semiconductor wafer 16 to be processed has significant thickness variations across the surface 14 thereof. These variations are the result of conventional chemo-mechanical polishing techniques. Typically, a bulk semiconductor wafer 16 is cut or sawed from a semiconductor boule, usually a silicon boule. Thereafter, the bulk semiconductor wafer 16 is subjected to a plurality of polishing and finishing processes. Conventionally, these processes operate simultaneously upon the entire surface 14. As a result, the surface 14 of the bulk semiconductor wafer 16 has a profile having a significant total thickness variation. Such total thickness variation over the total surface 14 can be between 1 micrometers and 15 micrometers.

In the system 10, the bulk semiconductor wafer 16 is delivered to the means 12 for determining the initial total thickness variation profile thereof. In the preferred embodiment, the means 12 measures the initial total thickness variation across the surface 14 of the bulk semiconductor wafer 16 on a point by point basis. One particular technique, although other techniques can also be used, for conducting ouch measurements is by the use of a capacitive thickness measurement instrument. Such instruments are generally commercially available and the use thereof is known. One particular instrument for making such measurements is the capacitive thickness measurement instruments manufactured and marketed by ADE, Inc. of Newton, Mass. Such an instrument can be adapted to provide on the order of 16,000 individual point measurements across the surface 14 of a bulk semiconductor wafer to provide an initial total thickness variation profile measurement of the surface 14.

The initial total thickness variation profile data representing the point by point thickness measurements of the surface 14 is then processed by the means 18 for converting the initial total thickness variation profile to a dwell time versus position map 20. The dwell time versus positioned map is then stored in the system controller 22. As more fully discussed with respect to FIG. 3, the preferred means 24 for selectively locally removing material from the surface 14 in accordance with the dwell time versus position map 20 is a non-contact plasma etching electrode assembly having an etching footprint smaller than a representative variation dimension along the surface 14 of the bulk semiconductor wafer 16. The input data to the converting means 18 includes at least three factors, the measured initial total thickness variation profile data, the desired final total thickness variation profile data and the spatial material removal rate pattern of the plasma etching electrode assembly. In the event that the spatial material removal rate pattern is unknown for a particular semiconductor material, empirical measurements should be taken on that material prior to the formation of the dwell time versus position map. The initial total thickness variation profile and the desired final total thickness variation provide a thickness error map of material thickness to be removed from the surface 14 of the wafer 16. Effectively, in one instance, the thickness error map is generated by a point by point subtraction of the desired end thickness from the measured initial thickness. In an embodiment wherein a the resultant surface is to be below the lowest point of the initial total thickness variation, a constant can be added to all of the measurements. In general, the means 18 for converting the initial total thickness variation profile to a dwell time versus position map 20 can be a personal computer having appropriate peripheral input/output devices communicating therewith. Similarly, the system controller 22 can be any of the typical computer controllers readily available for machine control operations.

Subsequent to the creation of the thickness error map, the dwell time versus position map 20 is computed. The dwell time versus position map 20 represents the length of time that the localized material removal tool will spend over each specified position across the surface 14 to produce the final total thickness variation across the surface 14. The dwell time versus position map computation incorporates the spatial material removal rate of the localized material removal tool. In one embodiment, the dwell time versus position map 20 is calculated using a known two-dimensional fast Fourier transform implementation of the Fourier Deconvolution Theorem on the thickness error map.

The dwell time versus position map 20 is used by the system controller 22 to generate a set of instructions to the translating mechanism of the localized material removal tool. The instructions are used to control the velocity to the tool over the surface 14 in a predetermined path so as to execute the dwell time versus position map 20 to produce the final total thickness variation across the surface 14. In the embodiment shown in FIG. 3, the machine instructions control the motion of a stage so that the surface 14 of the bulk semiconductor wafer 16 is moved under the material removal tool. Although the instructions can be translated into different coordinate systems, it is preferred that the instructions control the stage in accordance with a polar coordinate system.

Figure 3:
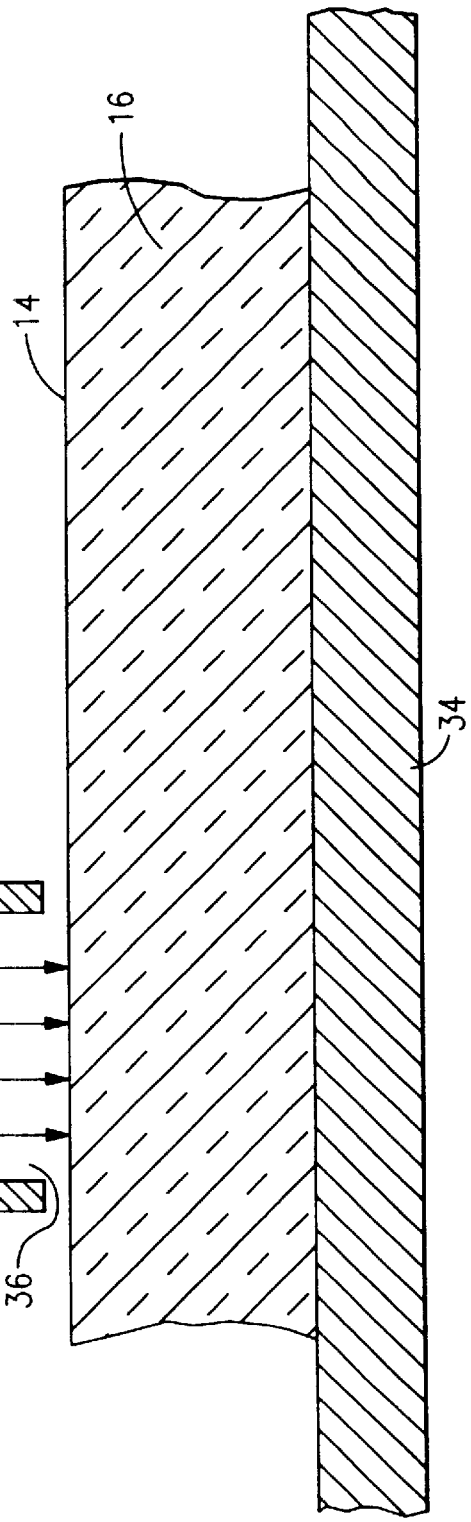
FIG. 3 which is a cross-sectional view of an apparatus particularly adapted for the selective localized removal of material.

As shown in FIG. 3 the means 24 for selectively locally removing material from the surface 14 includes a means 32 for producing a confined plasma and means 34 for providing relative movement between the confined plasma producing means 32 and the surface 14 of the bulk semiconductor wafer 16. Preferably, the means 32 for producing a confined plasma includes a plasma cavity 36 defined by a wall 38. The means 32 for producing a confined plasma also include means 40 for supplying a plasma feed gas into the cavity 36 and means 42 for providing RF power to ignite and maintain the plasma from the feed gas. As well known in the art, the entire means 24 for selectively locally removing material from the surface 14 is disposed in a vacuum chamber, not shown in the drawing. The basic operation of such a means 32 for producing a confined plasma is fully discussed and described in U.S. Pat. No. 4,668,366 issued to Charles B. Zarowin on May 26, 1987 and entitled Optical Figuring By Plasma Assisted Chemical Transport And Etching Apparatus Therefor. The principles and teachings of that patent are hereby incorporated herein by reference.

The means 34 for providing relative movement between the confined plasma producing means 32 and the surface 14 of the bulk semiconductor wafer 16 preferably includes a stage that can provide movement in response to the polar coordinate map generated by the system controller 22. Alternatively, the means 34 can include an x-y stage that provides relative movement between the confined plasma producing means 32 and the surface 14 of the bulk semiconductor wafer 16 in two orthogonal directions. Such means 34 for providing relative movement are known in the art and further detailed description thereof is not believed necessary for a complete understanding of the present invention.

The means 26 for delivering one or more bulk semiconductor wafers 16 to the means 12 for determining the initial total thickness variation of the surface 14 and the means 30 for transporting the bulk semiconductor wafers 16 from the means 24 for removing material can include one or more wafer holders 44. In one embodiment, the wafer holders 44 are conventional semiconductor wafer cassettes and are delivered and removed using conventional automated cassette handling systems.

In one embodiment, the means 28 for determining the final total thickness variation of a bulk semiconductor wafer 16 subsequent to the removal of material therefrom is the same type as that used for the means 12 for determining the initial total thickness variation of the wafer 16. It will be understood that the same measuring instrument can be used for both the initial and final total thickness variation measurements.

Although the present invention has been described herein with respect to a particular embodiment it will be understood that other configurations and arrangements may be implemented by those skilled in the art which do not depart from the spirit and scope hereof. Hence, the present invention is deemed limited only by the claims appended hereto and the reasonable interpretation thereof.

What is claimed is:

1. A system for controlling the total thickness variation of a surface of a bulk semiconductor wafer; said system comprising:

means for determining an initial total thickness variation profile for said surface of said wafer;

means for generating a dwell time versus position map for said surface of said wafer, said map being generated from said initial total thickness variation profile; and means for selectively locally removing material by plasma etching from said surface of said wafer, said selective local material removal means being controlled in accordance with said dwell time versus position map.

2. The system as claimed in claim 1 wherein said initial total thickness variation profile determining means measures said initial total thickness variation on a point by point basis.

3. The system as claimed in claim 1 wherein said means for determining the initial total thickness variation profile is a capacitive thickness measuring instrument.

4. The system as claimed in claim 1, further comprising:

means for delivering one or more bulk semiconductor wafers to said initial total thickness variation profile determining means.

5. The system as claimed in claim 1 further comprising:

means for transporting one or more bulk semiconductor wafers away from said selectively locally material removal means.

6. The system as claimed in claim 1 wherein said generating means includes means for subtracting said initial total thickness variation profile data for preselected total thickness variation profile data on a point by point basis such that said dwell time versus position map represents a surface having said preselected total thickness variation.

7. The system as claimed in claim 1 wherein said means for selectively locally removing material includes:

means for producing a confined plasma; and means for providing relative motion between said surface of said bulk semiconductor wafer and said confined plasma producing means.

8. The system as claimed in claim 7 wherein said confined plasma producing means includes a cavity wherein said plasma in confined.

9. The system as claimed in claim 8 wherein said confined plasma producing means further includes:

means for supplying a plasma feed gas into said cavity; and means for providing RF power to ignite and maintain said confined plasma.

10. The system as claimed in claim 7 wherein said means for providing relative motion between said surface of said bulk semiconductor wafer and said confined plasma includes a stage capable of providing movement in accordance with a polar coordinate reference system.

11. The system as claimed in claim 7 wherein said means for providing relative motion between said surface of said bulk semiconductor wafer and said confined plasma includes an x-y stage capable of providing movement in two orthogonal directions.

12. The system as claimed in claim 1 further including means for determining a final total thickness variation profile for said surface of said bulk semiconductor wafer.

13. The system as claimed in claim 12 wherein said means for determining said final total thickness variation profile is the same instrument as said means for determining said initial total thickness variation profile.

14. The system as claimed in claim 1, further comprising:

means for delivering one or more bulk semiconductor wafers to said initial total thickness variation profile determining means;

means for transporting one or more bulk semiconductor wafers away from said selectively locally material removal means; and means for determining a final total thickness variation profile for said surface of said bulk semiconductor wafer.

15. A method for improving the total thickness variation of a surface of a bulk semiconductor wafer, said method comprising the steps of:

determining an initial total thickness variation profile of said surface;

generating a dwell time versus position map; and selectively locally removing material from said surface of said semiconductor wafer by plasma etching in accordance with said dwell time versus position map such that the total thickness variation across the surface is improved.

16. The method as claimed in claim 15 wherein said selective local material removal step includes moving said wafer relative to a confined plasma.

17. The method as claimed in claim 15 further including the step of:

determining, subsequent to said material removal step, a final total thickness variation across said surface of said bulk semiconductor wafer.

* * * * *